US009355067B1

(12) United States Patent
Monga et al.

(10) Patent No.: US 9,355,067 B1
(45) Date of Patent: May 31, 2016

(54) DISTRIBUTION OF PARAMETER CALCULATION FOR ITERATIVE OPTIMIZATION METHODS

(71) Applicant: Google Inc., Mountain View, CA (US)

(72) Inventors: Rajat Monga, Sunnyvale, CA (US); Xiaoyun Wu, Palo Alto, CA (US); Andrew Yan-Tak Ng, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/691,362

(22) Filed: Apr. 20, 2015

Related U.S. Application Data (63) Continuation of application No. 13/428,985, filed on Mar. 23, 2012, now Pat. No. 9,015,083.

(51) Int. Cl.
| | |
|---|---|
| *G06N 99/00* | (2010.01) |
| *G06F 17/00* | (2006.01) |
| *G06F 17/50* | (2006.01) |
| *G06F 17/10* | (2006.01) |

(52) U.S. Cl.
CPC ............ *G06F 17/10* (2013.01); *G06F 17/5009* (2013.01); *G06N 99/005* (2013.01)

(58) Field of Classification Search
None
See application file for complete search history.

(56) References Cited

U.S. PATENT DOCUMENTS

| 7,933,847 B2 | 4/2011 | Andrew et al. | |
|---|---|---|---|
| 2009/0037401 A1 | 2/2009 | Li et al. | |
| 2012/0158624 A1* | 6/2012 | Lingenfelder | G06F 17/18 706/12 |
| 2012/0330867 A1 | 12/2012 | Gemulla et al. | |

OTHER PUBLICATIONS

Byrd et al., "Parallel Quasi-Newton Methods for Unconstrained Optimization." Published by Univ. Colorado, Apr. 1, 1988.
Chen, X., "A Parallel BFGS-SQP Method for Stochastic Linear Programs," Computational Techniques and Applications (CTAC, 1995).
Lee, et al., "On Optimization Methods for Deep Learning," Proceedings of the 28th International Conference on Machine Learning (WA 2011).
Ruey-Lung, H., "Link-based and Content-based Evidential Information in a Belief Network Model," SIGIR, Oct. 11, 2000.
Still, C.H., "The Parallel BFGS Method for Unconstrained Minimization," IEEE publ. 0-8186-2290-3/91/0000/0347, (IEEE, 1991).

(Continued)

*Primary Examiner* — Stanley K Hill
*Assistant Examiner* — Mikayla Chubb
(74) *Attorney, Agent, or Firm* — Fish & Richardson P.C.

(57) ABSTRACT

Systems and methods are disclosed for distributed first- or higher-order model fitting algorithms. Determination of the parameter set for the objective function is divided into a plurality of sub-processes, each performed by one of a plurality of worker computers. A master computer coordinates the operation of the plurality of worker computers, each operating on a portion of the parameter set such that no two worker computers contain exactly the same parameter subset nor the complete parameter set. Each worker computer performs its sub-processes on its parameter subset, together with training data. For maximum efficiency, the sub-processes are performed using a compact set of instruction primitives. The results are evaluated by the master computer, which may coordinate additional sub-process operations to perform higher-order optimization or terminate the optimization method and proceed to formulation of a model function.

20 Claims, 5 Drawing Sheets

(56) References Cited

OTHER PUBLICATIONS

Wen et al., "Parallel Distributed Belief Networks That Learn," Proceedings of the 12$^{th}$ International Joint Conference on Artificial Intelligence (AIS, TRL, 1991).

Dean et al., "MapReduce: Simplified Data Processing on Large Clusters," Operating Systems Design and Implementation Conference (OSDI, 2004).

Kozlov et al., "A Parallel Lauritzen-Spiegelhalter Algorithm for Probabilistic Interference," IEEE 1063-9535/94 (IEEE 1994).

Nocedal et al., "Numerical Optimization," pp. 165-191, Springer Press (2006).

Oliver, T., "Parallel Algorithms for the BFGS Update on a PUMA Machine," University of Liverpool (Sep. 1991).

Wu, G. "A Modified Parallel BFGS Method for Nonconvex Functions," International Journal of Advancements in Computing Technology, vol. 3, No. 9 (Oct. 2011).

Ng, A., "Feature selection, L1 vs. L2 regularization, and rotational invariance," (ICML 2004), Apr. 14, 2005, 20 pages.

Dean et al., "DistBelief: Distributed learning and inference for large Deep Networks," (Jun. 20, 2011), PowerPoint Presentation, 93 pages.

Byrd et al., "A Limited Memory Algorithm for Bound Constrained Optimization," (May 1994), Northwestern University, Department of Electrical Engineering and Computer Science, Technical Report NAM-08, 25 pages.

Le et al., "On Optimization Methods for Deep Learning," 2011.

Wang et al., "Drinking Activity Analysis from Fast Food Eating Video Using Generative Models," 2009.

Lee et al, Unsupervised feature learning for audio classification using convolutional deep belief networks, 2009.

Batista et al., "Bilingual Experiments on Automatic Recovery of Capitalization and Punctuation of Automatic Speech Transcripts," 2012.

Caruana et al., "SpamCloud: A Map Reduce based Anti-Spam Architecture," 2010.

Dong et al., "A Fast Parallel Optimization for Training Support Vector Machines," 2003.

* cited by examiner

DISTRIBUTION OF PARAMETER CALCULATION FOR ITERATIVE OPTIMIZATION METHODS

CROSS-REFERENCE TO RELATED APPLICATION

This application is a continuation of U.S. application Ser. No. 13/428,985, filed May 23, 2012, the disclosure of which is hereby incorporated by reference in its entirety.

BACKGROUND

The present disclosure is related to systems and methods for optimization in mathematical modeling, and more specifically to systems and methods for parallelizing aspects of such problems to reduce time-to-solution and improve modeling performance.

Model fitting is a technique for developing a function (the objective function) that generalizes observed relationships between dependent and independent variables, such as between a system's input and a system's output, response of a physical process, etc. As an example, one may create a table associating the numbers of years individuals in a test group have played golf and their golf handicaps. Given that set of known years of play and corresponding handicaps, a mathematical model may be developed to estimate or predict handicaps for years of play for which there is no actual data. That is, an objective function may be developed which approximates the actual observed data, and which can be used to estimate responses in cases where actual data does not exist.

An example of such an objective function is a regression expression, such as:

$$h(x) = \theta_0 + \theta_1 x + \theta_2 x^2 + \ldots + \theta_n x^n$$

where $\theta_i$ are parameters. It will be appreciated that other forms of expressions have similar properties but different functional expressions.

Cases in which a set of labeled (known) input and corresponding output data is provided for the purpose of developing an objective function(s) are generally referred to as supervised learning problems, and the data set is generally referred to as a labeled training set. Cases in which the data set is not labeled (e.g., there is no indication of the nature of the training data) are generally referred to as unsupervised learning, and the data set is generally referred to as an unlabeled training set. The present disclosure applies to both supervised and unsupervised (as well as hybrid) learning techniques. However, specific techniques for supervised and unsupervised learning are beyond the scope of this disclosure.

An objective function may be a classifier or a regression function. If outputs of the function are discrete values, the function is often referred to as a classifier. If outputs of the function are continuous values, the function is often referred to as a regression function.

In the process of determining appropriate parameters for an objective function, a starting set of parameters are often provided, and the parameters are refined to fit labeled or unlabeled training data. Once an acceptable set of parameters are determined, the objective function may be evaluated for input values not present in the training set (i.e., the objective function may be used to make predictions). Model fitting is a crucial and often very time consuming component of machine-learning and forecasting algorithms.

Many examples of applications of model fitting exist today. Among the many example applications are image classification such as where the model is fitted to label a set of pictures based on an already labeled subset of the images. In this case, the application may learn to detect features and use the detected features to identify whether a picture belongs to a class. In general this has several practical applications, such as handwriting recognition, automatic labeling for search, filtering unwanted results, etc.

Another example application of model fitting may include natural language processing. In this example, classifying sound samples may be used to recognize words or phrases, determine speaker language, translate spoken words, and transcribe spoken words. Sound classification may also be used to control hardware and/or software, and serve as a form of human-computer interface.

A further example application of model fitting may include text analysis and recognition. In this example, handwriting or typography may be recognized and converted to a digital format, evaluated for content, authenticity, and so on. Applications include optical character recognition, text filtering (e.g., spam filtering in email), and hardware and/or software control, such as serving as a form of human-computer interface.

Other example applications of model fitting may include forecasting and predicting, such as for traffic patterns (e.g., physical or data traffic), human behavior (e.g., consumer decisions), financial patterns (e.g., housing prices), propagation (e.g., disease spreading), diagnoses (e.g., likelihood of malignancy), and so on. This can be used for informed decision making, better resource allocation and so on.

When developing the objective function h(x), referred to as an hypothesis, the "closeness" of the hypothesis (and hence the accuracy of the parameters) to the actual input/output relationship is examined. One example of a measure of this closeness is referred to as a "cost function", such as given by the relationship:

$$J(\vec{\theta}) = \frac{1}{2m} \sum_{i=1}^{m} [(h_{\vec{\theta}} x^{(i)}) - y^{(i)}]^2$$

where $\vec{\theta}$ is a vector of parameters $[\theta_1, \theta_2, \ldots \theta_n]$, $X^{(i)}$ is the $i^{th}$ input variable, $y^{(i)}$ is the $i^{th}$ output variable, and m is the number of training examples. The values of $\vec{\theta}$ are determined such that $J(\vec{\theta})$ is minimized and the hypothesis, h(x), most closely models the actual relationship represented in the training set (and hence the system from which the training set is obtained).

A wide variety of methods are in use today for determining the vector $\vec{\theta}$ of parameters that most closely represents the observed data. Certain of these methods rely on attributes of the objective function represented by a first derivative or first partial derivative (such as the gradient of the objective function), and accordingly are referred to as "first-order" methods. Other methods rely on attributes of the objective function represented by higher order derivatives (such as second partial derivatives), and are accordingly referred to as methods of "order greater than one," or equivalently "higher-order" methods. Higher-order methods present a number of advantages over first-order methods. One advantage is that higher-order methods are generally more autonomous, and converge more reliably without significant user intervention. First-order methods, however, converge with fewer associated computations, meaning they provide lower computational cost when compared to higher-order methods.

A number of higher-order methods are known. One example is the Broyden-Fletcher-Goldfarb-Shanno ("BFGS") method. BFGS is a member of the family of secant methods (quasi-Newtonian methods) used for finding a root of the first derivative of a target function. In general these methods examine the curvature of the target function in order to provide convergence on a minima of the function $J(\vec{\theta})$. Therefore, BFGS relies on evaluation of the second order partial derivatives, in square matrix form referred to as the Hessian ($\nabla^2 J(\theta)$) matrix, that describes local curvature.

In many modern problems, such as image or speech recognition, there may be very large training sets, for example millions or more data pairs. However, evaluating the Hessian matrix for such relatively large data sets is computationally quite expensive and slow; in some cases the data set is sufficiently large that a problem cannot be reasonably computed on a single computer. Therefore, limited-memory methods, such as the limited-memory BFGS (L-BFGS) method have been developed to reduce computing cost and improve scalability for large data sets. In L-BFGS the Hessian matrix is only approximated, and a relatively small history of prior estimates is sufficient for the algorithm to converge on a minima. (See, e.g., Nocedal, Numerical Optimization (Springer, 2006), e.g., pp. 164-189, the entirety of which is incorporated herein by reference.) Nonetheless, it is generally accepted that even limited-memory methods such as L-BFGS do not scale well to very large data sets from storage and computation cost perspectives. While BFGS and L-BFGS are referred to above, similar reasoning applies to other known higher-order methods. Therefore, for reasons of storage and computation cost, even though less autonomous than higher order methods, there is a preference for first-order methods such as gradient descent when the training set is very large.

In order to provide the benefits of higher order methods while reducing associated compute costs, distributed, parallel operation of methods such as L-BFGS has been explored. In one such distributed operation the data set is broken up into groups referred to as shards. In one example, each shard is operated on by an independent ("worker") processor, which calculates certain values, such as estimating appropriate derivatives for that shard of data. The results from each independent processor are provided to a "master" processor, which ultimately forms evaluates the overall cost function, and updates the parameter vector.

According to such known methods for independent processing of data shards, a complete replica of the parameter vector is provided to each worker processor. The worker processor calculates derivatives or gradients for its particular shard, and may evaluate the cost function for that data as well. The worker processor provides the gradient calculations (and/or the cost function evaluation) to the master processor. The master processor then modifies a master set of parameters in an effort to minimize the cost function for all shards.

While this distribution of the data and processing parallelizes the processing of the large training set, and thereby reduces compute cost, there is a desire to further reduce cost to provide effective parallel processing in higher order methods such as L-BFGS and the like. In particular, there is a high computational cost for distribution of the entire parameter vector to each worker processor, and further cost for processing of the entire parameter vector by each worker processor.

SUMMARY

Accordingly, the present disclosure is directed to systems and methods providing reduced computation cost when performing certain first order (e.g., line-search) and higher-order methods for objective function determination, and more specifically, determination of the parameter model or vector. Determination of the parameter set for the objective function is divided into a plurality of sub-processes, each performed by one of a plurality of worker computers. The parameter set is apportioned among the various worker computers such that no two worker computers contain exactly the same parameter subset nor the complete parameter set. Each worker computer performs sub-processes, typically assigned by the master computer, on the parameter subset together with training data. For maximum efficiency, the sub-processes are performed using a compact set of instruction primitives. The results are evaluated for closeness of fit to the training data, and the closeness determination results are provided to the master computer. In certain cases, parameters may also be passed to the master computer. The master computer uses the closeness determinations from the worker computers determine the closeness of the overall model. If further refinement is requited, further sub-process may be run on the worker computers and the respective parameters updated and reevaluated.

Accordingly, a computer-based system for optimizing a data model is disclosed, comprising: a master computer system controlling an iterative optimization process for optimizing a parameter set; a plurality of worker computer systems communicatively coupled to the master computer system; a plurality of parameter subsets, which together form the parameter set, each of the parameter subset being stored by one of the worker computer systems such that each worker computer system has stored thereon a different portion of the parameter set, and further such that no worker computer system contains the complete parameter set; each of the plurality of worker computer systems configured to perform at least one sub-process of the iterative optimization process, the sub-process utilizing at least a portion of the parameter subset stored by the worker computer system together with data from a training set, each the worker computer system providing results of the at least one sub-process it performs to the master computer system; and the master computer system utilizing the results provided by the worker computer systems to evaluate the iterative optimization process resulting in an update of the parameter set and optimizing the data model.

In this regard, a master computer system is communicatively coupled to a plurality of worker computer systems, such as in a cluster, such that each worker computer system performs at least one sub-process, but less than the entirety, of an iterative optimization process for optimizing a parameter set, the iterative optimization process operated by the master computer system, each worker computer system further comprising: a computer readable storage medium comprising a parameter subset, which forms a portion, but less that the entirety, of a parameter set, a training data set, and a set of instruction primitives; and a processor configured to perform the at least one sub-process utilizing at least a portion of the parameter subset, the training data set, and at least one of the instruction primitives, the worker computer system providing results of the at least one sub-process it performs to the master computer system.

One goal of the present disclosure is to provide systems and methods to permit performing applications, such as deep learning, using higher-order optimization methods when the parameter set is sufficiently large that performing such methods on a single computer system is not practicable. Dividing up the parameter set amongst a plurality of worker computers, and assigning each worker computer the task of performing sub-processes of the higher-order method, such as gradient calculation and closeness determination at data points assigned to each worker computer system, provides distributed parameter calculation. Each worker computer performs sub-processes to update its parameter subset. The sub-processes may run independently, or certain sub-process from certain worker computers may be dependent on sub-processes run by other worker computers. Appropriate worker computer intercommunications permit such dependencies. Similarly, each worker computer determines the closeness of a portion of a data model based on its parameter subset to appropriate training data. The closeness determinations may run independently, or certain closeness determinations by certain worker computers may be dependent on closeness determinations run by other worker computers. The results of the worker computer systems sub-processes and/or closeness determinations are returned to the master computer system, which may then perform further operations in converging to an appropriate data model. For example, the master computer may determine whether the current result satisfies a convergence criterion. If so, the iterative parameter determination may terminate. If not, the master computer system sets the worker computers to re-execute their respective sub-processes.

In order that each worker computer most efficiently effectively perform its respective sub-processes, a minimal set of instruction primitives are provided to each worker computer system. An example of such a minimum set consists of: fill, scale dot product, affine, random initialization, L1/L2 regularization, and box clip point/box clip gradient.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well-known techniques, components, equipment and other details may merely be summarized or are omitted so as not to unnecessarily obscure the details of the present disclosure. Thus, where details are otherwise well-known, we leave it to the application of the present disclosure to suggest or dictate choices relating to those details.

Figure 1:
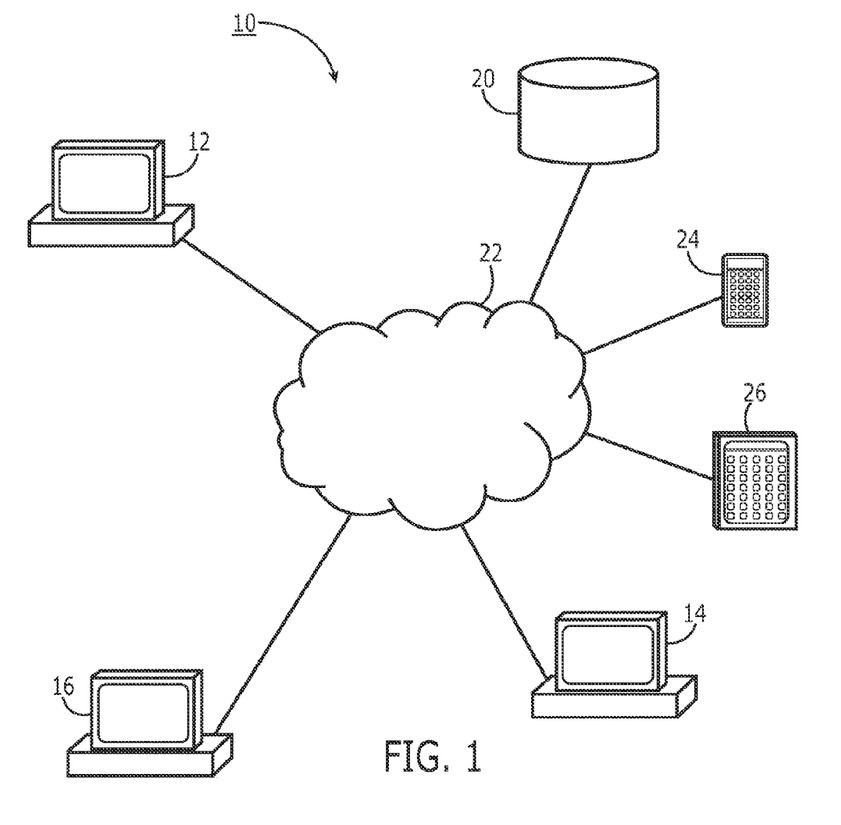
FIG. 1 is a high-level representation of a distributed network environment, comprising hardware elements, within which various embodiments of the present disclosure may be employed.

With reference initially to FIG. 1, a distributed network environment 10 is shown, comprising hardware and software operating therewith, within which various embodiments of the present disclosure may be employed. More specifically, distributed network environment 10 comprises multiple interconnected elements of hardware, each running software, allowing those elements of hardware to communicate with one another, whether by wired or wireless connection. Such elements of hardware include, but are not limited to, a first workstation 12, a second workstation 14, a third workstation 16, and network services 20 such as remote storage, each communicating via the public Internet 22. The workstations and generally may be referred to as computer devices. Other computer devices, such as mobile computationally-enabled telephone handsets (so called "smart phones") 24, tablet-style computer devices 26, and so on may also form a part of network environment 10.

Alternatives to using public Internet 22, or additional interconnection mechanisms include local area networks (LANs), wide area networks (WANs), etc. Alternatives to workstations, or additional computer mechanisms include personal computers, servers that are personal computers, minicomputers, personal digital assistants (PDAs), mainframes, etc. The network within which the various embodiments of the present disclosure operates may also comprise additional or fewer devices without affecting the scope of the present disclosure.

First, second, and third client workstations 12, 14, 16 may communicate via the public Internet 22 using known Web browser software or dedicated, specific-purpose application software. As is well known, software components supporting computer devices 12, 14, 16, 24, 26, and network services 20, include or reference logic and/or data that may form a part of the software component or be embodied in or retrievable from some other hardware of software device or signal, either local or remote and coupled via a network or other data communications device.

Thus, embodiments of the invention may be implemented as methods, apparatus, or articles of manufacture as or in software, firmware, hardware, or any combination thereof, stored in computer-accessible memory or operating on some element of hardware. As used herein, article of manufacture (or alternatively, computer program product) is intended to encompass logic and/or data accessible from any computer-readable device, carrier, or media.

Those skilled in the art will recognize many modifications may be made to this exemplary environment without departing from the scope of the present disclosure. For example, it will be appreciated that aspects of the present disclosure are not dependent upon data structure formats, communications protocols, file types, operating systems, database management system, or peripheral device specifics. Accordingly, the following description is provided without reference to specific operating systems, protocols, or formats, with the understanding that one skilled in the art will readily be able to apply this disclosure to a system and format of choice.

For purposes of illustrating one embodiment of a network environment in which the present disclosure may be embodied, we will refer to workstation 12 as a "master" computer, and workstations 14 and 16 as "worker" computers. Worker computers 14 and 16 may be similar or different machines, and may form a cluster or similar collection of computing devices. It will be understood that aspects of master computer 12 may perform similar functions to those performed by worker computers 14 and 16, and likewise aspects of worker computers 14, 16 may perform similar functions to those performed by master computer 12. Furthermore, the number of actual master and worker computers is not fixed, but may vary depending on the implementation of the present disclosure.

According to the present embodiment, master and worker computers together are configured to cooperatively execute at least one optimization algorithm. Typically, the optimization algorithm will be a so-called higher-order method, such as L-BFGS, but certain first order methods (such as the so-called line-search method) may also be employed. The present embodiment provides for performing the optimization algorithm in a distributed fashion. Accordingly, a framework is provided for (a) distributed storage of large parameter sets amongst the various worker computers, and (b) provision of a set of primitive operations to each worker computer for efficient execution of the at least one optimization algorithm.

Figure 2:
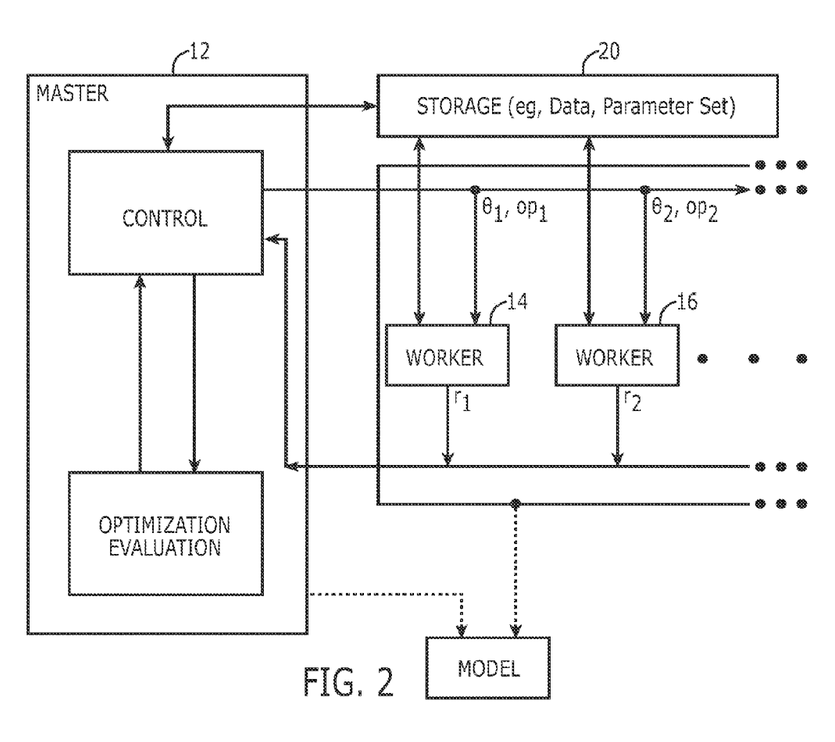
FIG. 2. Is a high-level flow diagram illustrating aspects of distributed computing of a parameter set according to an embodiment the present disclosure.

FIG. 2 illustrates the connection between various components, and the exchange of data and values therebetween, according to various embodiments of the present disclosure. Master computer 12 has various routines operating on a processor, discussed in further detail below, which govern communication with worker computers 14, 16 and possibly other computers, services, and devices. One such routine causes an initial subset of parameters to be either generated on each worker computer (such as by random generation) or provided from a storage device 20 such as memory associated with the master computer or separate remote storage. A different, selected subset is thereby accessible to each of worker computers 14, 16. Another such routine requests that certain operations, for example $op_1$, $op_2$, be performed by each worker computer 14, 16, respectively, and the results of those operations $r_1$, $r_2$, be provided back to master computer 12. Using results $r_1$, $r_2$, possibly together with data (stored on worker computers 14, 16, on storage device 20, or otherwise accessible to worker computers 14, 16) and routines otherwise resident on and/or accessible to the processor of master computer 12, a step in an iterative optimization routine is evaluated. For example, each worker computer 14, 16 may perform a sub-process of an optimization routine. The result of the sub-process may be an updated parameter subset. The worker computers 14, 16 may then evaluate their respective parameter subset for closeness to a training data set. The results of the closeness determination may be provided to the master, which evaluates closeness determinations from all worker computers and determines if the iterative optimization process may terminate. If so, a data model is provided, either by the master computer or by the plurality of worker computers (as used herein, dashed connector lines and boxes indicate an optional element or step). If the threshold is not reached at this point, the master computer provides instructions to the worker computers 14, 16 to perform additional sub-process, and update and evaluate the resulting parameter subset and data model.

Figure 3:
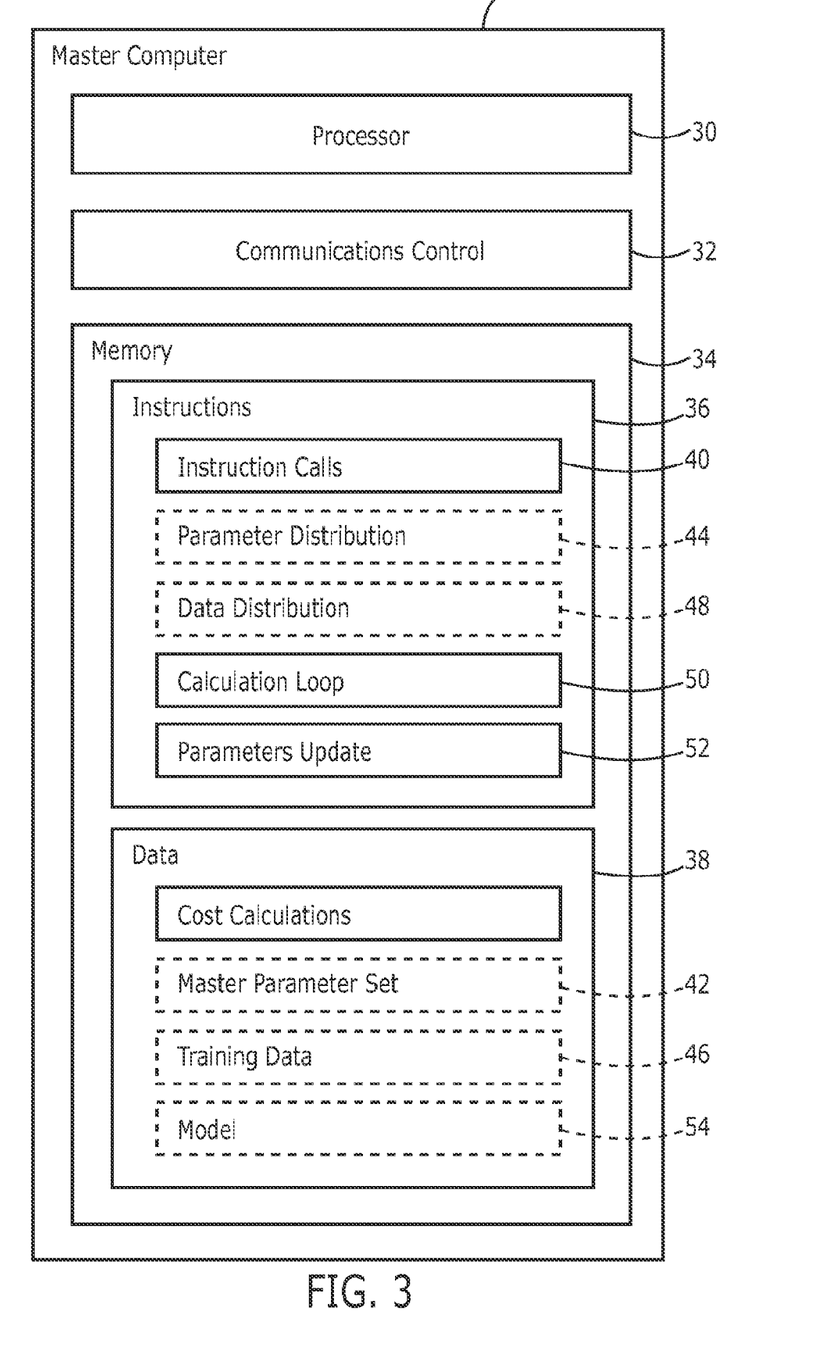
FIG. 3 is a block diagram illustrating various elements of hardware, software, and data as may be organized within a master computer according to an embodiment of the present disclosure.

As shown in FIG. 3, master computer 12 according to the present embodiment includes processor 30, communications control 32, memory 34, and possibly other components (not shown) typically present in general purpose computers.

Memory 34 stores information accessible by processor 30, including instructions 36, and data 38 that may be executed or otherwise used by the processor 30 and communications control 32. Memory 34 may be of any type capable of storing information accessible by the processor, including a computer-readable storage medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 36 may be any set of instructions to be executed directly (such as machine code) or indirectly (such as scripts) by processor 30. For example, instructions 36 may be stored as computer code on the computer-readable medium. In that regard, the terms "instructions" and "programs" may be used interchangeably herein. The instructions may be stored in object code format for direct processing by the processor, or in any other computer language including scripts or collections of independent source code modules that are interpreted on demand or compiled in advance. Functions, methods and routines of the instructions are explained in more detail below.

Data 38 may be retrieved, stored, and modified by processor 30 in accordance with the instructions 36. For instance, although the systems and methods disclosed herein are not limited by any particular data structure, the data may be stored in computer registers, in a relational database as a table having a plurality of different fields and records, XML documents or flat files. The data may also be formatted in any computer-readable format. Data may be stored as bitmaps comprised of grids of pixels stored in accordance with formats that are compressed or uncompressed, lossless (e.g., BMP) or lossy (e.g., JPEG), bitmap or vector-based (e.g., SVG), as well as computer instructions for drawing graphics. The data may comprise any information sufficient to identify the relevant information, such as numbers, descriptive text, proprietary codes, references to data stored in other areas of the same memory or different memories (including other network locations) or information that is used by a function to calculate the relevant data.

Processor 30 may be any conventional processor, such as commercially available CPUs. Alternatively, the processor may be a dedicated controller such as an ASIC or other hardware-based processor. Although FIG. 1 functionally illustrates processor 30, communications control 32, and memory 34 as being within the same block, it will be understood by those of ordinary skill in the art that these elements may actually comprise multiple processors, multiple communications controls, and multiple memories that may or may not be disposed within the same physical housing. For example, one element of memory may be a hard drive or other storage media located in a data center remote from processor 30. Accordingly, references to a processor, communications controls, memory, or computer will be understood to include references to a collection of processors, communications controls, memories or computers, respectively, that may or may not operate in parallel.

Instructions 36 includes a set of components. For example, instruction calls component 40 makes calls to worker computers, requesting that they perform certain calculations, and return the results of those calculations, using their respective parameter subset, as well as training data. An example of such a call is $$\text{result} = \text{DotProduct}(\vec{S}_0, G)$$

by which a master computer requests all connected worker computers to calculate the dot product of a vector $S_0$ and a gradient calculation G, and store that dot product as the value "result". In certain embodiments, a sharding component 44 is responsible for accessing a master parameter set 42 and dividing that set up into different subsets that are provided to worker computers by communications control 32. In other embodiments, a data distribution component 48 provides some or all of a training data set to worker computers, also by way of communications control 32. (The goal of the optimization process is to arrive at the optimum values for the parameter set 42, and hence provide an optimized model.) Calculation loop component 50 utilizes the results returned from the worker computers to evaluate the results from the worker computers (referred to as a new parameter set) to determine if the new parameter set improves the accuracy of the model. If not, a parameters update component 52 determines appropriate instruction calls required to initiate another iteration of the sub-process by the worker computers, and makes those calls as previously discussed. These calls ultimately update the model, which in one embodiment may itself be distributed among the worker computers, or in another embodiment may be stored at 54 in memory associated with master computer 12. However stored, the updated parameter set then forms a portion of the data model that models the training data and forecasts results for which training data is not available.

It should be noted that a great many parameter values may comprise the master set of parameter set, for example 1 billion or more values. By dividing the master parameter set up among the worker computers, significant time savings (in terms of sequential calculation time) is realized. Dividing up the master parameter set is to be contrasted with dividing up training data. In known system, data shards are distributed to various processors, together with the complete parameter set. Current algorithms for optimization, particularly higher-order algorithms, depend on the presence of a complete parameter set to operate properly. However, according to the present disclosure, each worker computer is provided with a subset of the complete parameter set, as well as various instruction primitives, routines, and data that enable it to perform sub-calculations on the parameter subset. The role of the master computer is then to coordinate operation of the worker computers by providing instruction calls, evaluate the results of the calculations of the worker computers, and pass judgment on the quality of the parameter set and data model. In certain embodiments, the master computer may also maintain and distributed the complete parameter set and/or the complete training data set. In the embodiments described herein, the training data may be distributed in shards to the worker computers, or the training data may be provide in whole, as may be appropriate for specific implementations. In certain embodiments the training data set is so large (on the order of terabytes) that remote storage and access is warranted.

Figure 4:
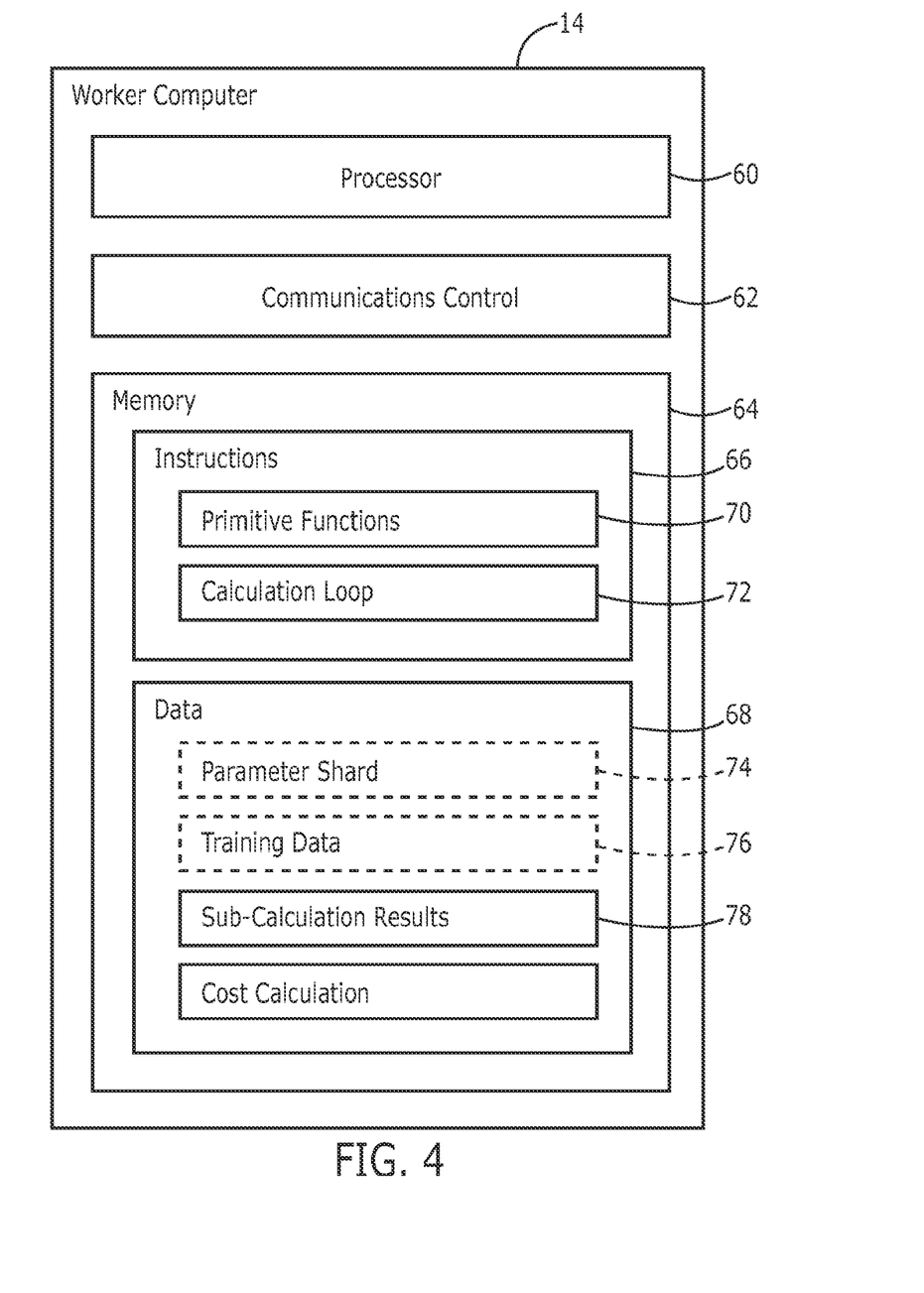
FIG. 4 is a block diagram illustrating various elements of hardware, software, and data as may be organized within a worker computer according to an embodiment of the present disclosure.

Accordingly, as shown in FIG. 4, each worker computer according to the present embodiment, for example worker computer 14, includes a processor 60, communications control 62, memory 64, and possibly other components (not shown) typically present in general purpose computers. Memory 64 stores information accessible by processor 60, including instructions 66, and data 68 that may be executed or otherwise used by the processor 60 and communications control 62.

Instructions 66 include primitive functions 70 for performing sub-calculations used to execute a tailored optimization algorithm running on the master computer. The selection of the appropriate sub-calculations enables the running of the optimization algorithm running on the master computer. While the specific set of sub-calculations may vary from implementation to implementation, the distribution of certain sub-calculations to the various worker computers can be efficiently implemented with the following set of primitive functions resident in instruction memory 66:

Fill—fills assigned elements of an array (or matrix) with an assigned value

Scale—scales (e.g., multiplies) assigned elements of an array (or matrix) by a scale factor Dot Product—performs the dot product on two portions of an array (or matrix)

Affine—performs the affine function, $\vec{y} = A\vec{x} + \vec{b}$

Random Initialization—randomizes assigned elements of an array (or matrix)

L1/L2 Regularization—performs model selection operation to address overfitting Box Clip Point/Box Clip Gradient Instructions 66 further include a calculation loop 72 that utilizes the primitive functions 70, parameter shard 74, and training data 76 to perform calculations based on a request from the master computer received through communications control 62. Again, the parameter shard 74 and/or training data 76 may be stored on memory directly associated with worker computer 14, or be stored remotely and accessed by worker computer 14 as and when needed. The sub-calculation results 78 may then be provided to the master computer for use in the optimization method being performed thereby, or used directly to evaluate the closeness of at least a portion of the data model using the parameters determined by the worker computer to the training data.

Typically, master computer 12 issues an instruction call to all worker computers 14, 16 simultaneously. In certain system architectures, such as system 60 illustrated in FIG. 5, one set of worker computers $W_{11}, W_{12}, \ldots W_{1n}$ may be associated together to perform one set of sub-process $F_1$ on a respective parameter subset $\vec{\theta}_1$. Another set of worker computers $W_{21}, W_{22}, \ldots W_{2n}$ may be associated together to perform one set of sub-process $F_2$ on a respective parameter subset $\vec{\theta}_2$, and so on. Typically, each parameter subset assigned to each worker computer will have substantially the same number of parameters, although this can change for specific applications of the present disclosure.

Figure 5:
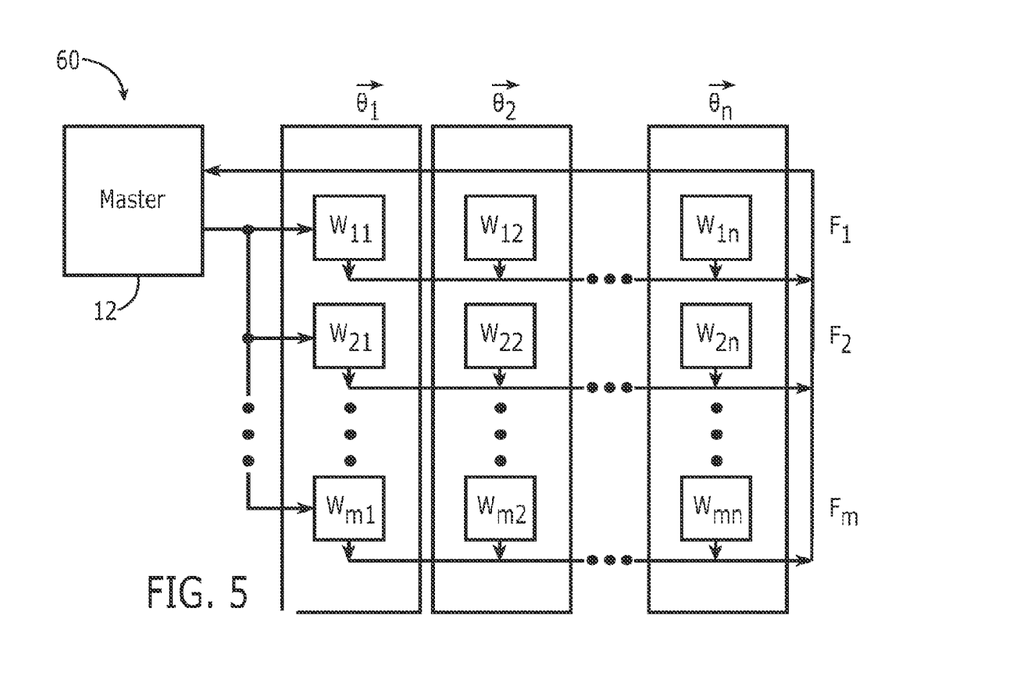
FIG. 5 is a block diagram of a network comprising a master computer and multiple worker computers configured to enable distributed operation of an iterative optimization algorithm.

In a similar system architecture, different sets of worker computers may perform the same sub-processes on different data subsets. Typically, each training data subset assigned to each worker computer will have substantially the same number of data points, although this can change for specific applications of the present disclosure. The training data may be divided randomly, or one or more strategies may be used to divide the training data. An example of such a strategy is pre-identification of data set elements (e.g., in image data, identifying a face), and assignment of data on an element-by-element basis.

In each case, worker computer process may be synchronous or asynchronous, and the master computer may utilize results from worker computers as they become available. In general, the master computer is not required to track the actions of each worker computer separately. However, in certain embodiments the master may maintain a table of identification data of worker computers, parameter and data subsets, and so forth, in cases where individual addressing of worker computers is warranted. Should a worker computer die in process, the results of other worker computers may be evaluated and a model nonetheless constructed, or alternatively the last good point used by the system may be restored, the data and parameter subsets reapportioned to exclude the non-functioning worker computer, and iterative processing resumed.

Therefore, the present disclosure provides systems and methods for optimizing a data model. Such optimization may take the form of a data model and training set that each comprise classifications of data as an image portion. Worker computer systems are configured such they perform a closeness evaluation to measure the similarity of the image portions of the data model and the training set. When closeness falls below a set threshold, the model may be deemed a sufficient representation of the training set that it can be used to predict future values.

The images above may be still images or video images. They may be images of handwriting from which handwriting recognition may be performed. In place of images, the system and methods above may also operate on audio clips. Further, the audio clips may be human speech, and the resulting model may be used for identification of words or phrases, identification of speaker language, identification of translated spoken words, identification of actions to be taken by a computer system for control of hardware or software, and so on. Further still, the data model and training set may be portions of digital text, and the worker computer determines parameters and evaluates the closeness of a model based on those parameters that represents the text. In one embodiment, the model may characterize text as favorable or unfavorable, such as determining if an email is "spam" by examining the content of the email. Many other applications will, however, present themselves to one skilled in the art from the disclosure provided herein.

The embodiments described, and hence the scope of the claims below, encompass embodiments in hardware, software, firmware, or a combination thereof. It will also be appreciated that the methods, in the form of instructions, may be operating on or in a computer processor (such as a CPU, ASIC, or the like). Such instructions, including their sequence, syntax, and related data, may be stored on (or in) any of a wide variety of computer-readable media such as magnetic media, optical media, magneto-optical media, electronic media (e.g., solid state ROM or RAM), etc., the form of which media not limiting the scope of the present disclosure. A computer reading the media is operable to either transfer (e.g., download) the instructions thereto and then operate on those instructions, or cause the instructions to be read from the media and operate in response thereto. Furthermore, devices (e.g., a reader) for accessing the instructions on the media may be contained within or connected directly to the computer on which those instructions operate, or may be connected via a network or other communication pathway to the computer.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A system for optimizing a data model having a parameter set comprising a plurality of parameters, the system comprising:
    a master computer system controlling an iterative optimization process for optimizing the parameter set of the data model, wherein the master computer system is configured to perform operations comprising:
        dividing the parameter set of the data model into a plurality of parameter subsets;
        assigning each of the parameter subsets to a respective one of a plurality of worker computer systems, wherein each worker computer system is assigned a different parameter subset, and wherein no worker computer system is assigned the complete parameter set;
        receiving, from each of the worker computer systems, results of a respective evaluation of a closeness of fit, wherein each respective evaluation is an evaluation of a closeness of fit of classifications generated by the data model for a set of training data to known outputs for the set of training data, and wherein each respective evaluation is performed after the worker computer system has performed at least one sub-process of the iterative optimization process on the set of training data to determine updates for the values for the parameters in the parameter subset assigned to the worker computer system;
        determining an overall closeness of fit of the data model using the results of the respective evaluations of the closeness of fit received from each of the worker computer systems; and
        determining whether or not to perform another iteration of the iterative optimization process based on the overall closeness of fit of the data model.

2. The system of claim 1, further comprising:
    the plurality of worker computer systems, wherein each of the plurality of worker computer systems is configured to perform operations comprising:
        perform at least one sub-process of the iterative optimization process on the set of training data to determine updates for the values for the parameters in the parameter subset assigned to the worker computer system and to evaluate the closeness of fit of classifications generated by the data model to known outputs for the set of training data, and
        provide the results of the evaluation of the closeness of fit to the master computer system.

3. The system of claim 2, further comprising a computer accessible memory device communicatively coupled to each of the plurality of worker computer systems, wherein the computer accessible memory device stores a master parameter set.

4. The system of claim 3, wherein the at least one sub-process performed by each worker computer system includes updating the master parameter set with the updated values for the parameters in the parameter subset assigned to the worker computer system.

5. The system of claim 1, wherein the operations that the master computer system is configured to perform further comprise sending a communication to each of the worker computer systems to cause the worker computer systems to initiate the at least one sub-process.

6. The system of claim 1, wherein, when the master computer system determines that another iteration should be performed, the operations that the master computer system is configured to perform further comprise:

generating a plurality of updated parameter subsets using the updates;
distributing each updated parameter subset to a respective worker computer system; and
instructing each worker computer system to replace any existing parameter subset stored thereby with the updated parameter subset.

7. The system of claim 1, wherein each worker computer is configured to perform the at least one sub-process using only instruction primitives selected from the group consisting of: fill, scale dot product, affine, random initialization, and L1/L2 regularization.

8. The system of claim 1, wherein the iterative optimization process is a method of order greater than one.

9. The system of claim 8, wherein the method of order greater than one comprises an L-BFGS method.

10. A method for optimizing a data model having a parameter set comprising a plurality of parameters, the method comprising:
dividing, by a master computer system controlling an iterative optimization process for optimizing the parameter set of the data model, the parameter set of the data model into a plurality of parameter subsets;
assigning, by the master computer, each of the parameter subsets to a respective one of a plurality of worker computer systems, wherein each worker computer system is assigned a different parameter subset, and wherein no worker computer system is assigned the complete parameter set;
receiving, by the master computer system and from each of the worker computer systems, results of a respective evaluation of a closeness of fit,
wherein each respective evaluation is an evaluation of a closeness of fit of classifications generated by the data model for a set of training data to known outputs for the set of training data, and
wherein each respective evaluation is performed after the worker computer system has performed at least one sub-process of the iterative optimization process on the set of training data to determine updates for the values for the parameters in the parameter subset assigned to the worker computer system;
determining, by the master computer system, an overall closeness of fit of the data model using the results of the respective evaluations of the closeness of fit received from each of the worker computer systems; and
determining, by the master computer system, whether or not to perform another iteration of the iterative optimization process based on the overall closeness of fit of the data model.

11. The method of claim 10, further comprising:
performing, by each worker computer system of the plurality of worker computer systems, at least one sub-process of the iterative optimization process on the set of training data to determine updates for the values for the parameters in the parameter subset assigned to the worker computer system and to evaluate the closeness of fit of classifications generated by the data model to known outputs for the set of training data, and
providing, by each worker computer system, the results of the evaluation of the closeness of fit to the master computer system.

12. The method of claim 11, wherein the at least one sub-process performed by each worker computer system includes updating a master parameter set stored on a computer accessible memory device communicatively coupled to each of the plurality of worker computer systems with the updated values for the parameters in the parameter subset assigned to the worker computer system.

13. The method of claim 10, further comprising:
sending, by the master computer system, a communication to each of the worker computer systems to cause the worker computer systems to initiate the at least one sub-process.

14. The method of claim 10, further comprising:
in response to determining that another iteration should be performed:
generating, by the master computer system, a plurality of updated parameter subsets using the updates;
distributing, by the master computer system, each updated parameter subset to a respective worker computer system; and
instructing, by the master computer system, each worker computer system to replace any existing parameter subset stored thereby with the updated parameter subset.

15. The method of claim 10, wherein each worker computer is configured to perform the at least one sub-process using only instruction primitives selected from the group consisting of: fill, scale dot product, affine, random initialization, and L1/L2 regularization.

16. The method of claim 10, wherein the iterative optimization process is an optimization method of order greater than one.

17. The method of claim 16, wherein the optimization method of order greater than one comprises an L-BFGS method.

18. A computer program product encoded on one or more non-transitory computer storage media, the computer program product comprising instructions that when executed by one or more computers cause the one or more computers to perform operations for optimizing a data model having a parameter set comprising a plurality of parameters, the operations comprising:
dividing, by a master computer system controlling an iterative optimization process for optimizing the parameter set of the data model, the parameter set of the data model into a plurality of parameter subsets;
assigning, by the master computer, each of the parameter subsets to a respective one of a plurality of worker computer systems, wherein each worker computer system is assigned a different parameter subset, and wherein no worker computer system is assigned the complete parameter set;
receiving, by the master computer system and from each of the worker computer systems, results of a respective evaluation of a closeness of fit,
wherein each respective evaluation is an evaluation of a closeness of fit of classifications generated by the data model for a set of training data to known outputs for the set of training data, and
wherein each respective evaluation is performed after the worker computer system has performed at least one sub-process of the iterative optimization process on the set of training data to determine updates for the values for the parameters in the parameter subset assigned to the worker computer system;
determining, by the master computer system, an overall closeness of fit of the data model using the results of the respective evaluations of the closeness of fit received from each of the worker computer systems; and determining, by the master computer system, whether or not to perform another iteration of the iterative optimization process based on the overall closeness of fit of the data model.

19. The computer program product of claim 18, the operations further comprising:

performing, by each worker computer system of the plurality of worker computer systems, at least one sub-process of the iterative optimization process on the set of training data to determine updates for the values for the parameters in the parameter subset assigned to the worker computer system and to evaluate the closeness of fit of classifications generated by the data model to known outputs for the set of training data, and providing, by each worker computer system, the results of the evaluation of the closeness of fit to the master computer system.

20. The computer program product of claim 19, wherein the at least one sub-process performed by each worker computer system includes updating a master parameter set stored on a computer accessible memory device communicatively coupled to each of the plurality of worker computer systems with the updated values for the parameters in the parameter subset assigned to the worker computer system.

* * * * *